United States Patent [19]
McCutchan et al.

[11] Patent Number: 6,002,591
[45] Date of Patent: Dec. 14, 1999

[54] PRINTED CIRCUIT BOARD MOUNTING ASSEMBLY AND A METHOD FOR MOUNTING AN INTEGRATED CIRCUIT DEVICE

[75] Inventors: Dan R. McCutchan, Redwood City, Calif.; Glen Patrick Gordon, Federal Way; Leonard Ottis Turner, Vancouver, both of Wash.; Michael P. Brownell, Los Gatos, Calif.; Larry B. Wheeler, Olympia, Wash.

[73] Assignee: Intel Corporation, Santa Clara, Calif.

[21] Appl. No.: 08/902,850

[22] Filed: Jul. 30, 1997

[51] Int. Cl.⁶ .................................................. H05K 5/00
[52] U.S. Cl. .................. 361/753; 361/820; 361/825; 439/540.1; 206/701
[58] Field of Search .................................. 361/726, 728, 361/752, 753, 732, 740, 747, 768, 769, 820, 825; 439/540.1, 70, 71, 68; 206/701, 710, 711, 712, 715, 724; 324/765

[56] References Cited

U.S. PATENT DOCUMENTS

| | | | |
|---|---|---|---|
| 4,204,722 | 5/1980 | Yasui et al. .............................. | 439/391 |
| 4,504,887 | 3/1985 | Bakermans et al. ..................... | 361/758 |
| 4,840,576 | 6/1989 | Nierescher et al. ..................... | 439/331 |
| 5,006,962 | 4/1991 | Haley ...................................... | 361/807 |
| 5,073,116 | 12/1991 | Beck, Jr. .................................. | 439/71 |
| 5,400,904 | 3/1995 | Maston, III et al. .................... | 206/329 |
| 5,493,237 | 2/1996 | Volz et al. ............................. | 439/71 X |
| 5,567,177 | 10/1996 | Foerstel et al. .......................... | 439/526 |

*Primary Examiner*—Leo P. Picard
*Assistant Examiner*—Jayprakash N. Gandhi
*Attorney, Agent, or Firm*—Blakely, Sokoloff, Taylor & Zafman LLP

[57] ABSTRACT

The invention in one particular embodiment is a bracket including a base having an opening shaped to accommodate a socket for an integrated circuit device; and at least one containment member rigidly extending from the base to define a void shaped to accommodate the integrated circuit. In another embodiment, a method for mounting an integrated circuit device to a printed circuit board comprises affixing a bracket to the printed circuit board; mounting a socket to the printed circuit board; and coupling the integrated circuit to the socket, the integrated circuit being vertically and laterally constrained by the bracket.

19 Claims, 8 Drawing Sheets

PRINTED CIRCUIT BOARD MOUNTING ASSEMBLY AND A METHOD FOR MOUNTING AN INTEGRATED CIRCUIT DEVICE

BACKGROUND OF THE INVENTION

1. Field of the Invention

This invention pertains to mounting integrated circuit devices in electronic equipment, and more particularly, to a bracket for mounting microprocessors in computers.

2. Description of the Related Art

Microprocessors and other integrated circuit devices are frequently used in the design and operation of computers and other electronic equipment. Integrated circuit devices are typically mounted to a printed circuit board that is then inserted into a chassis. More precisely, the pins through which an integrated circuit device is electrically connected are usually aligned with and inserted into holes in a socket that is mounted to a board. The socket therefore bears the weight of the integrated circuit device and the pins "chafe" against the sides of the socket's holes. Care must also be taken in the design to ensure that the board can withstand frequently encountered, adverse environmental conditions such as shock and vibration.

These problems are usually exacerbated by a number of factors, especially since the boards are frequently oriented within the chassis substantially perpendicularly to the force of gravity. This orientation introduces a lateral force on the socket that complicates the task of bearing the integrated circuit device's weight and increases the chafing between the pins and the socket. This orientation also generally renders the board more susceptible to shock and vibration, thus necessitating additional countermeasures. Too, integrated circuit devices, especially microprocessors, are now more complex, are generally much heavier, and frequently have a larger number of pins. Each of these factors exacerbates the aforementioned problems, particularly when the board is oriented perpendicular to gravity.

While curing these problems and counteracting the exacerbating problems are not always difficult from a technological perspective, they frequently are intractable from an engineering standpoint because of constraints imposed for commercial viability. Among the most commonly encountered constraints are small size, low cost, and low weight. Small size is also becoming more critical from a technological perspective as system operating speeds continue to increase. Thus, it would be desirable to have a new technique that would alleviate pin chafing and facilitate the socket's load bearing function in a manner relatively impervious to adverse environmental conditions such as shock and vibration. It would also be desirable for such a new technique to do so in a manner amenable to meeting design constraints such as compactness while being light-weight and low cost to manufacture.

SUMMARY OF THE INVENTION

The invention in one particular embodiment is a bracket including a base having an opening shaped to accommodate a socket for an integrated circuit device; and at least one containment member rigidly extending from the base to define a void shaped to accommodate the integrated circuit. In another embodiment, a method for mounting an integrated circuit device to a printed circuit board comprises affixing a bracket to the printed circuit board; mounting a socket to the printed circuit board; and coupling the integrated circuit to the socket, the integrated circuit being vertically and laterally constrained by the bracket.

BRIEF DESCRIPTION OF THE DRAWINGS

A more particular description of the invention, one embodiment of which is summarized above, is set forth below by way of particular embodiments disclosed in the drawings of this specification and as described in connection therewith. The drawings nevertheless illustrate only typical, particular embodiments of the invention and are not to be considered limiting thereon as the invention may admit to other equally effective embodiments. In the drawings.

DETAILED DESCRIPTION OF SPECIFIC EMBODIMENTS

Numerous specific details are set forth below in the detailed description of specific embodiments to provide a thorough understanding of the present invention. However, one of ordinary skill in the art having the benefit of this disclosure will understand that the present invention may be practiced without many of the details presented since such details will be necessary or useful depending on the particular embodiment being employed. Conversely, in other instances, well known details have not been described for the sake of clarity so as not to obscure the invention. It will be appreciated that supplying such details would be a routine undertaking for those of ordinary skill in the art, even if a complex and time-consuming task, given the benefit of this disclosure.

Figure 1:
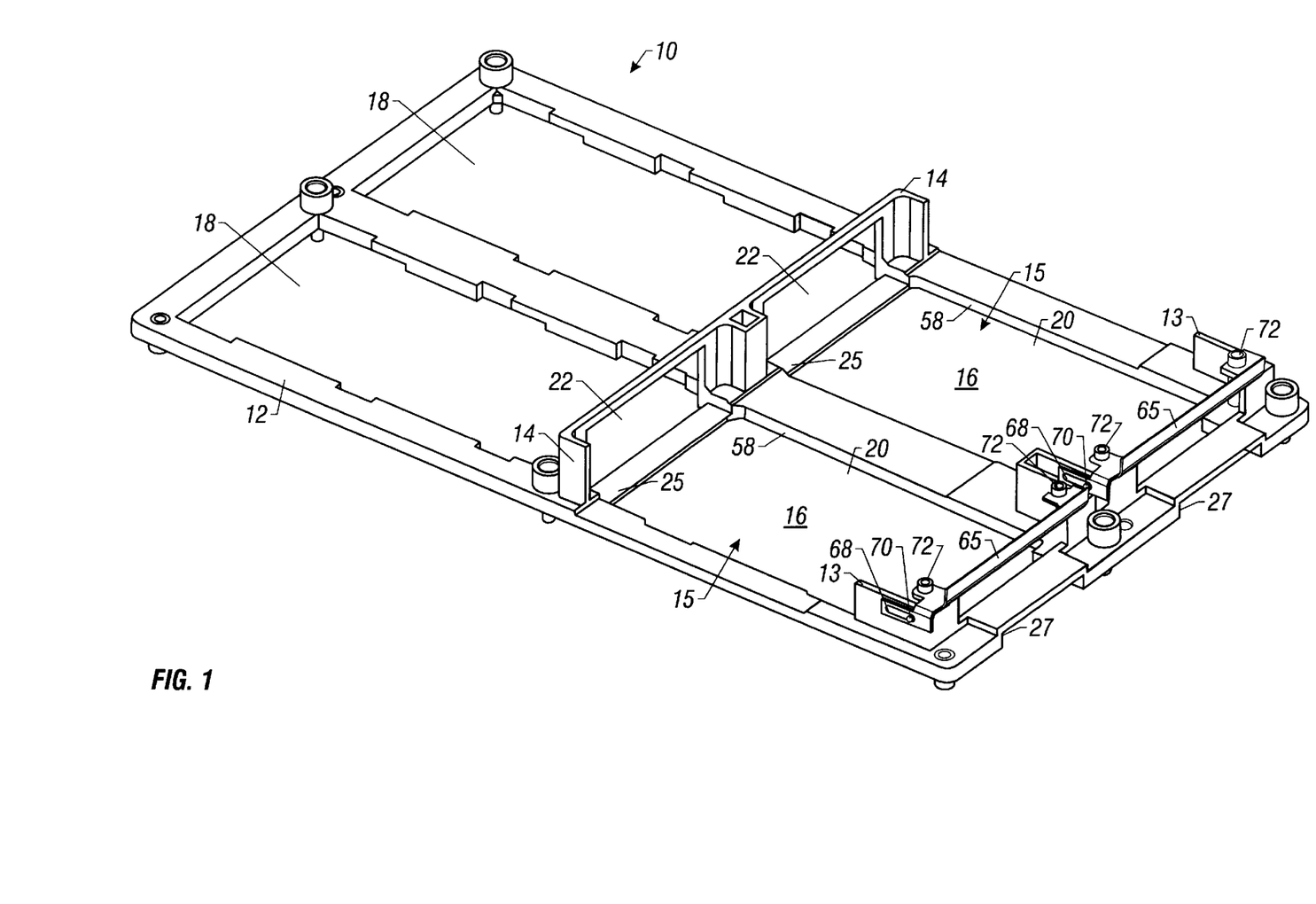
FIG. 1 is an assembled, isometric view of one particular embodiment of a mounting bracket in accordance with the present invention.
Figure 2:
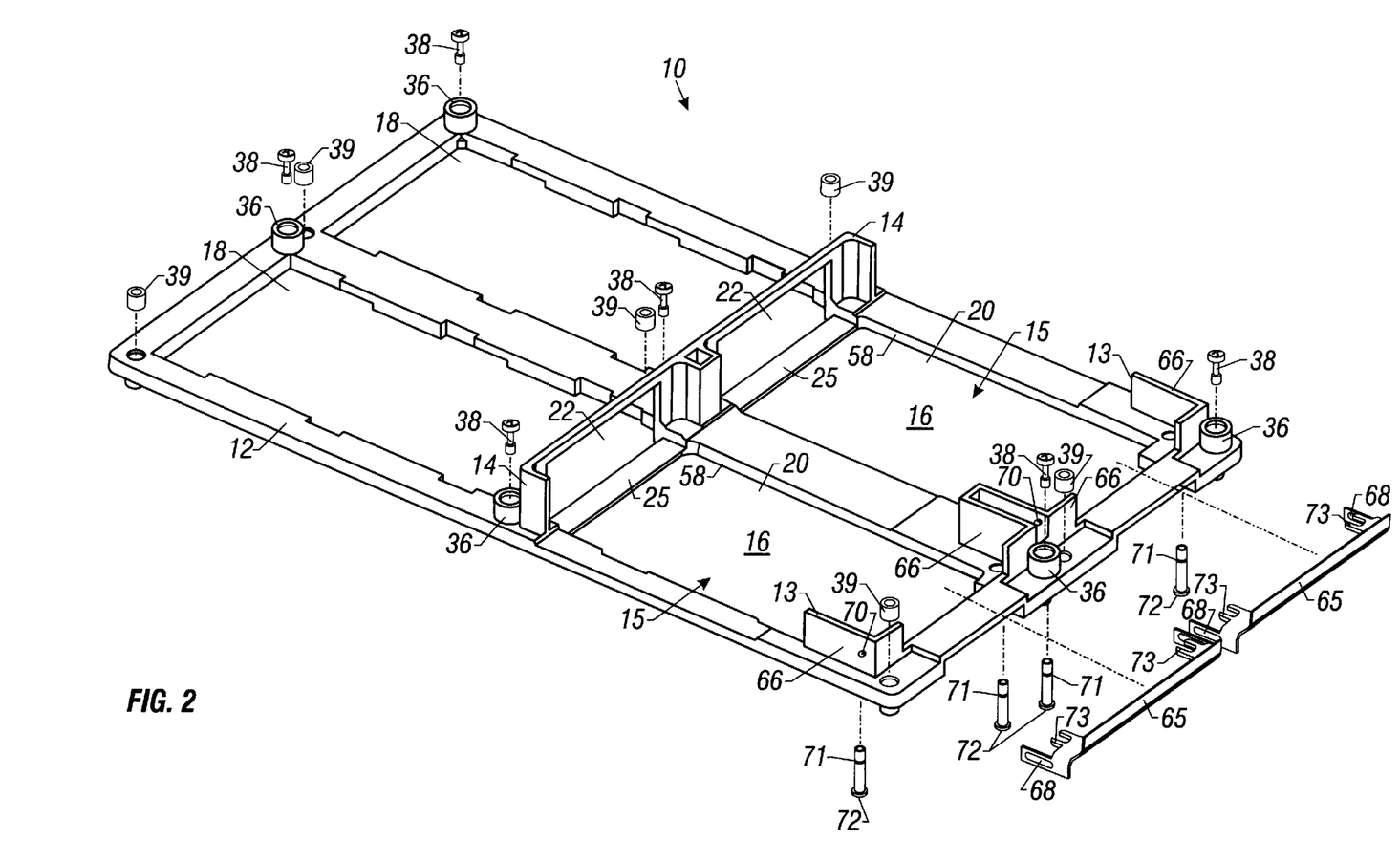
FIG. 2 is an exploded, isometric view of the embodiment in FIG. 1.

FIGS. 1 and 2 illustrate an assembled isometric view and an exploded isometric view, respectively, to a mounting bracket 10 constructed in accordance with the present invention. This particular embodiment of the invention comprises a base 12 and two containment members 13 and 14 rigidly extending from the base 12. The two containment members 13 and 14 define a void 15 shaped to accommodate an integrated circuit device, as illustrated FIGS. 4A and 4B and 5A and 5B and as discussed below. The phrase "shaped to accommodate" as used herein shall mean shaped so as to effect the applicable structural relationship necessary to vertically and laterally constrain the integrated circuit device as described more fully below.

Returning to FIGS. 1 and 2, although the bracket 10 in the particular embodiment illustrated includes two containment members 13 and 14, it is envisioned that alternate embodiments could be constructed in which the two containment members 13 and 14 are structurally joined together to effect a single containment member. Also, the base 12 and the containment member 14 in the particular embodiment shown are integrally formed and are constructed from a hardened, molded plastic. Preferably, the plastic is a polycarbonate having about 30% glass fill. The base 12 and the containment member 14 might, in alternative embodiments, comprise separate structures joined or affixed to one another by any suitable technique known to the art. For instance, in the embodiment of FIGS. 1 and 2, the containment member 13 generally comprises a stainless steel spring clip 65 engaged with two flanges 66 by the interaction of slots 68 and buttons 70. The spring clip 65, during assembly, is free to slide laterally, guided by the buttons 70 engaged in the slots 68. The engagement of the spring clip 65 is secured by a snap fit between a recessed ring 71 in stainless steel retaining pins 72, as shown, and notches 73 of the spring clip 65. Alternative embodiments may also be constructed from materials other than plastic and stainless steel.

The base 12 has two openings 16, each shaped to accommodate a socket for an integrated circuit device as discussed further below. The particular embodiment illustrated in FIG. 1 is shaped to accommodate either a low insertion force ("LIF") socket or a zero insertion force ("ZIF") socket such as are known in the art. Alternative embodiments might have an opening 16 shaped to accommodate only one or the other of a LIF socket and a ZIF socket. Further, is although the embodiment of FIG. 1 has two openings 16, some alternative embodiments may have more or fewer openings 16. For instance, only a single opening 16 may be desirable for some embodiments.

Figure 5A:
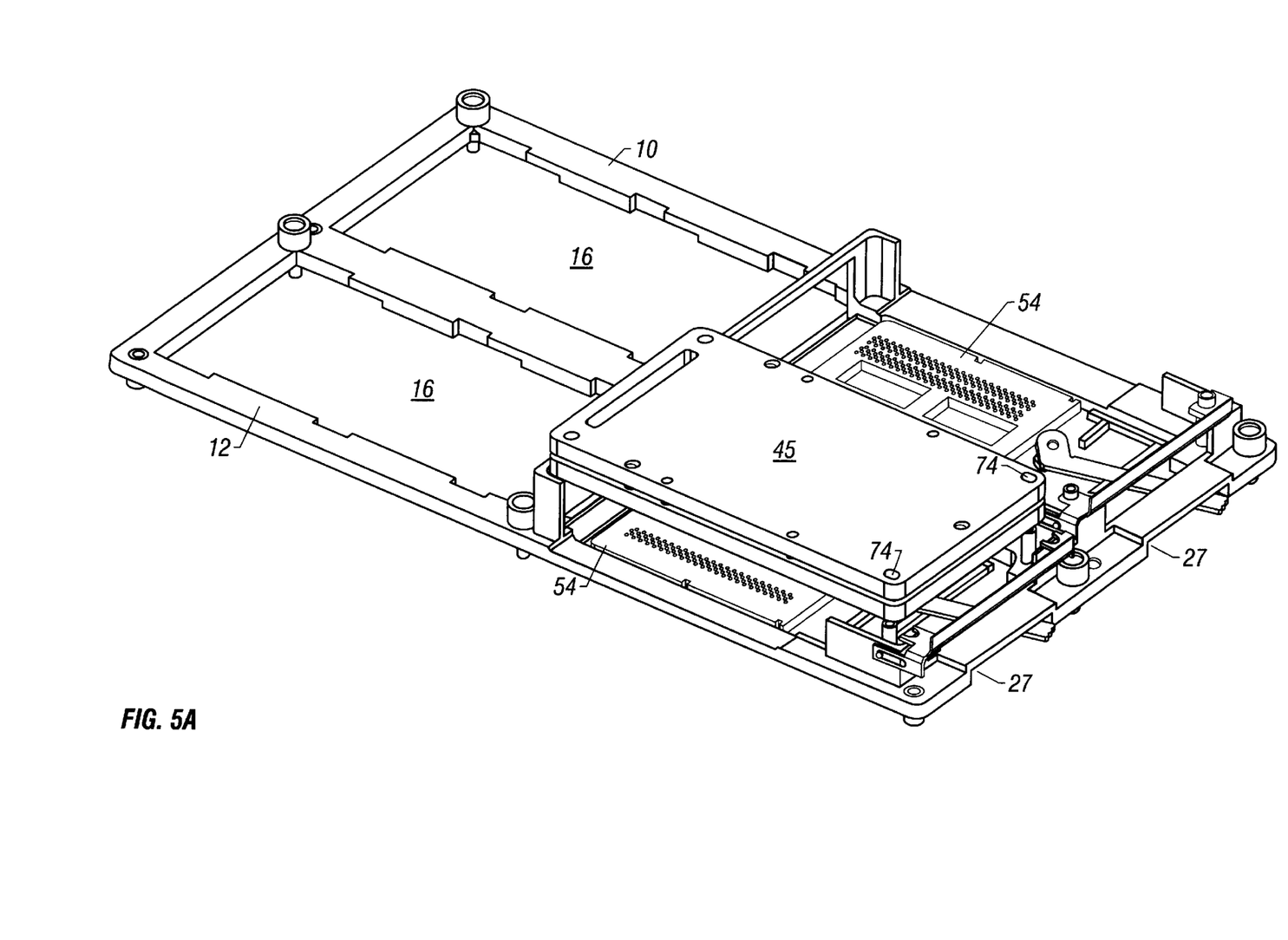
FIGS. 5A and 5B detail subassemblies of the embodiment in FIG. 3B in exploded and assembled views.
Figure 5B:
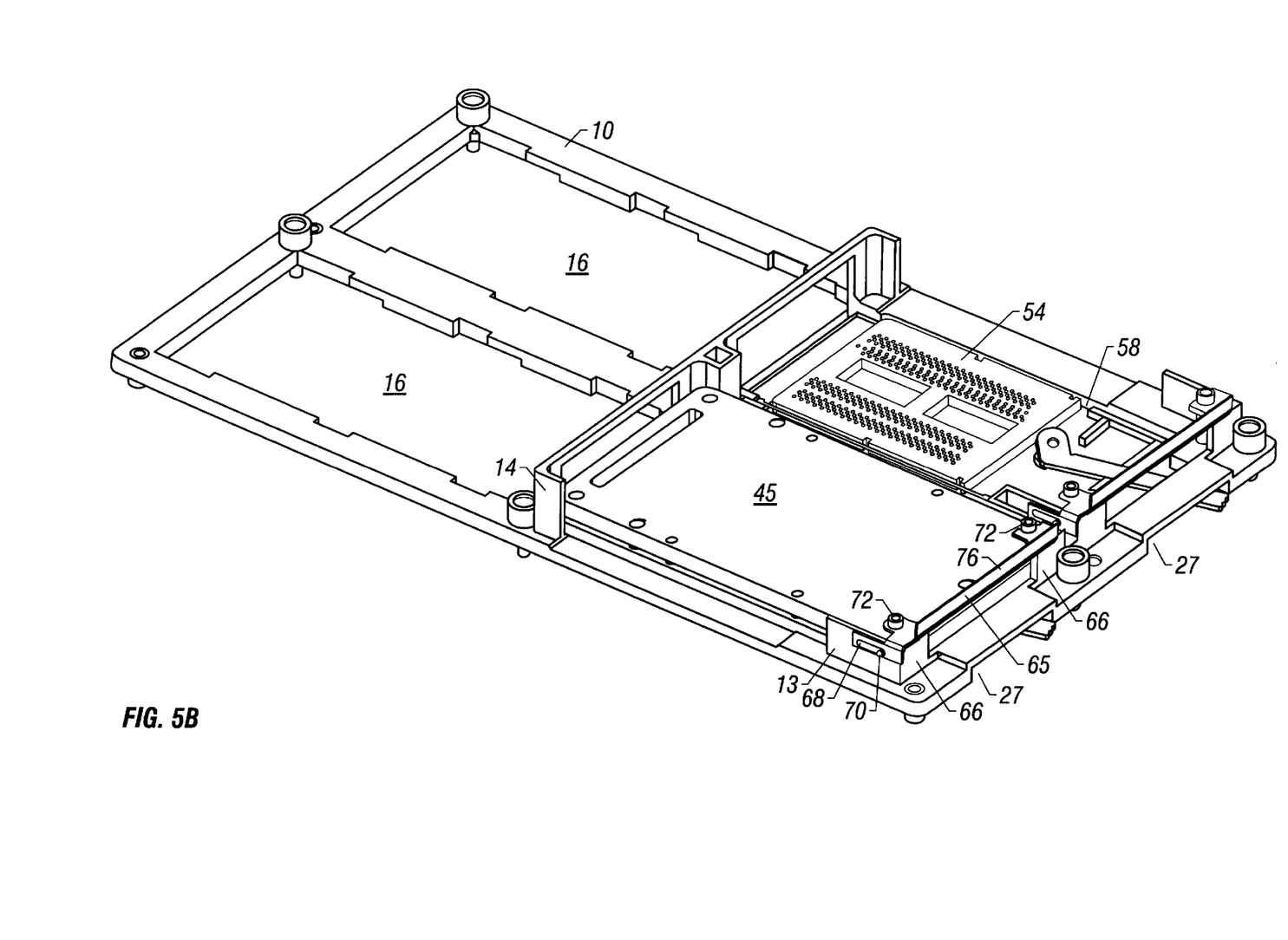

Still referring to FIGS. 1 and 2, each opening 16 of the particular embodiment illustrated is also shaped to accommodate a power pod, which may be a dc-dc converter as discussed below, although this is not necessary to the practice of the invention. More particularly, as shown in FIG. 1, one end 18 of the opening 16 is shaped to accommodate a power pod, whereas the other end 20 of the opening 16 is shaped to accommodate a socket. The containment member 14 also has a notch 22 through which a power pod may be electrically connected to an integrated circuit device when the bracket 10, a socket, an integrated circuit, and a power pod are assembled, as is discussed below in connection with FIGS. 3A and 3B. Note that the embodiment of FIG. 1 includes a rib 25 to increase structural strength, although this is not necessary to the practice of the invention. Thus, the notch 22 may be contiguous with the opening 16 in some embodiments. Further, in embodiments in which the opening 16 is not shaped to accommodate a power pod, the notch 22 may be omitted altogether. Note also that the particular embodiment illustrated includes slots 27 to accommodate the lever of a ZIF socket as is shown in FIGS. 3B, 5A, and 5B although slots 27 may be omitted in some embodiments.

Figure 3A:
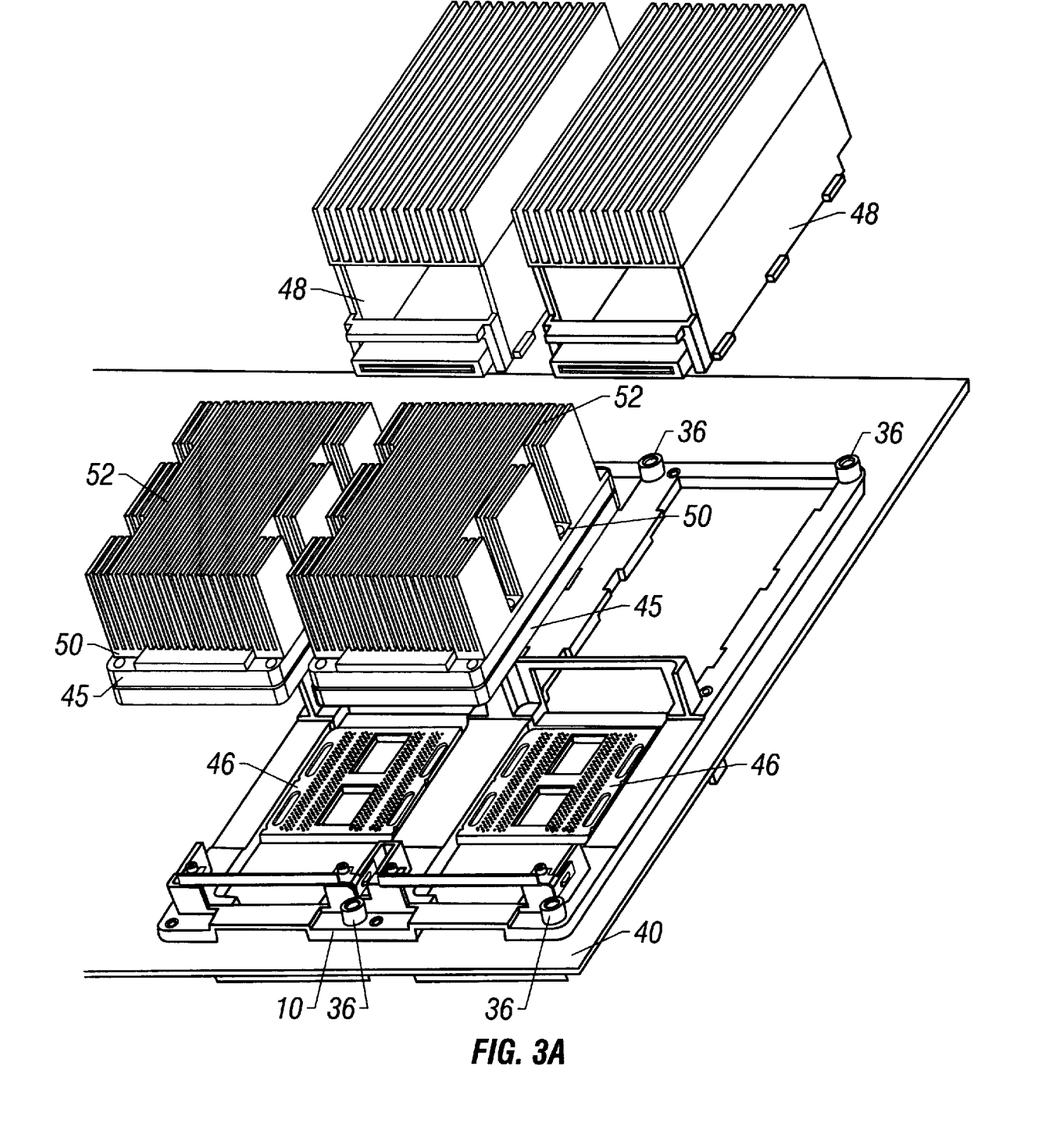
FIGS. 3A and 3B are partially exploded, isometric views of certain embodiments of the present invention wherein the mounting bracket of FIGS. 1 and 2 is combined with printed circuit boards, sockets, integrated circuit devices, and power pods.
Figure 3B:
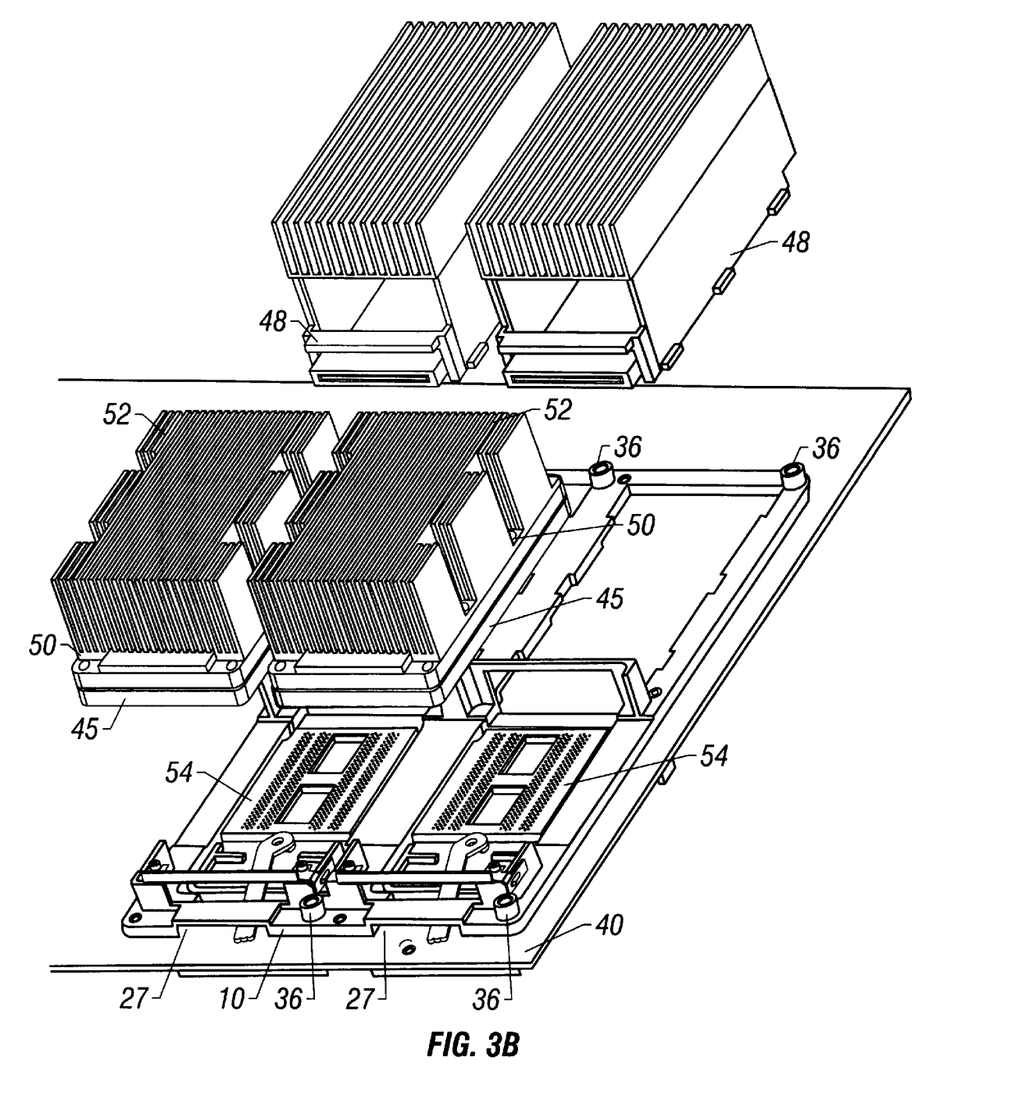

FIGS. 3A and 3B are, respectively, exploded and partially assembled isometric views of certain embodiments of the present invention wherein the mounting bracket 10 of FIGS. 1 and 2 is assembled with other components to produce printed circuit ("PC") board assemblies. More particularly, in the particular embodiment of FIG. 3A, the bracket 10 is assembled with two integrated circuit devices 45, each to be coupled to a LIF socket 46 and a power pod 48, which in the particular embodiment illustrated is a dc-dc converter. Two heat sinks 50 are mounted to heat spreaders 52 that, in turn, are each affixed to the integrated circuit devices 45. Similarly, in the particular embodiment of FIG. 3B, the bracket 10 is assembled with two integrated circuit devices 45, each to be coupled to a ZIF socket 54 and powered by a power pod 48. The power pods 48 may be electrically connected to the integrated circuit devices 45 by any means known to the art, such as by a ribbon cable (not shown). The two heat sinks 50 are mounted to the heat spreaders 52 that, in turn, are each affixed to the integrated circuit device 45. The integrated circuit devices 45 are preferably processors such as microprocessors or digital signal processors, but other types of integrated circuit devices may be employed for one, or both, of the integrated circuit devices 45 shown in FIGS. 3A and 3B.

Returning momentarily to FIGS. 1 and 2, the mounting bracket 10 includes at least one die 36 through which the fasteners 38 affix the bracket 10 to the printed circuit board 40. The embodiment of bracket 10 illustrated in FIGS. 1 and 2 is intended to be mounted to the printed circuit board 40 (shown in FIGS. 3A and 3B) directly opposite another such bracket 10 (not shown). Thus, the nuts 39 shown in FIGS. 1 and 2 are threaded onto the fasteners 38 of the bracket 10 that would be mounted to reverse side of the printed circuit board 40 as shown best in FIGS. 3A and 3B. Similarly, nuts 39 associated with a bracket 10 on the opposite side of printed circuit board 40 are threaded onto the fasteners 38 shown in FIGS. 1 and 2. The number of dies 36, fasteners 38, and nuts 39 is not material provided the bracket 10 is securely mounted to the printed circuit board 40. One particular embodiment employs six dies 36, fasteners 38, and nuts 39. Fasteners 38 in the embodiment illustrated are stainless steel captive screws and nuts 39 are constructed from brass, but other materials may be used. Other techniques may be employed to affix the mounting bracket 10 to the printed circuit board 40. For instance, an adhesive as may be known in the art may be applied to the surface contact between the bottoms of the bracket 10 and board 40 respectively. Still other embodiments may use other techniques.

Note that each of the embodiments of FIGS. 3A and 3B mounts two integrated circuit devices 45. As noted above, the bracket 10 may be used to mount a single integrated circuit device 45 and, in some embodiments, as many as four integrated circuit devices 45. The number of integrated circuit devices is not material to the practice of the invention. Further, the LIF sockets 46 and the ZIF sockets 54 may be mounted through the board 40 in a conventional technique that generally prevents utilization of four integrated circuit devices 45. However, in the particular embodiment illustrated, the LIF sockets 46 and the ZIF sockets 54 are surface mounted to the board 40, thus freeing the opposite side of board 40 for mounting additional integrated circuit devices 45.

Figure 4A:
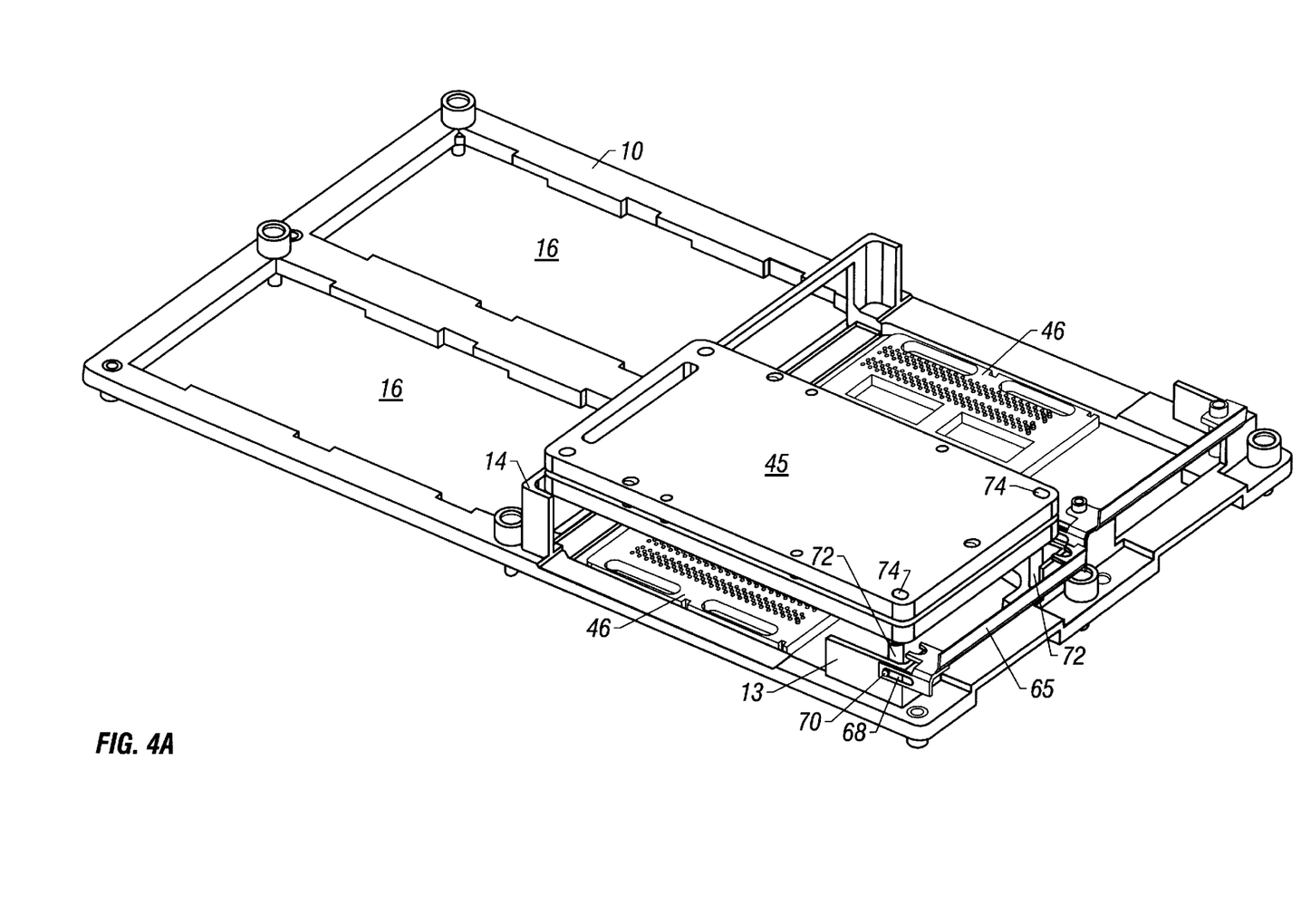
FIGS. 4A and 4B detail subassemblies of the embodiment in FIG. 3A in exploded and assembled views.
Figure 4B:
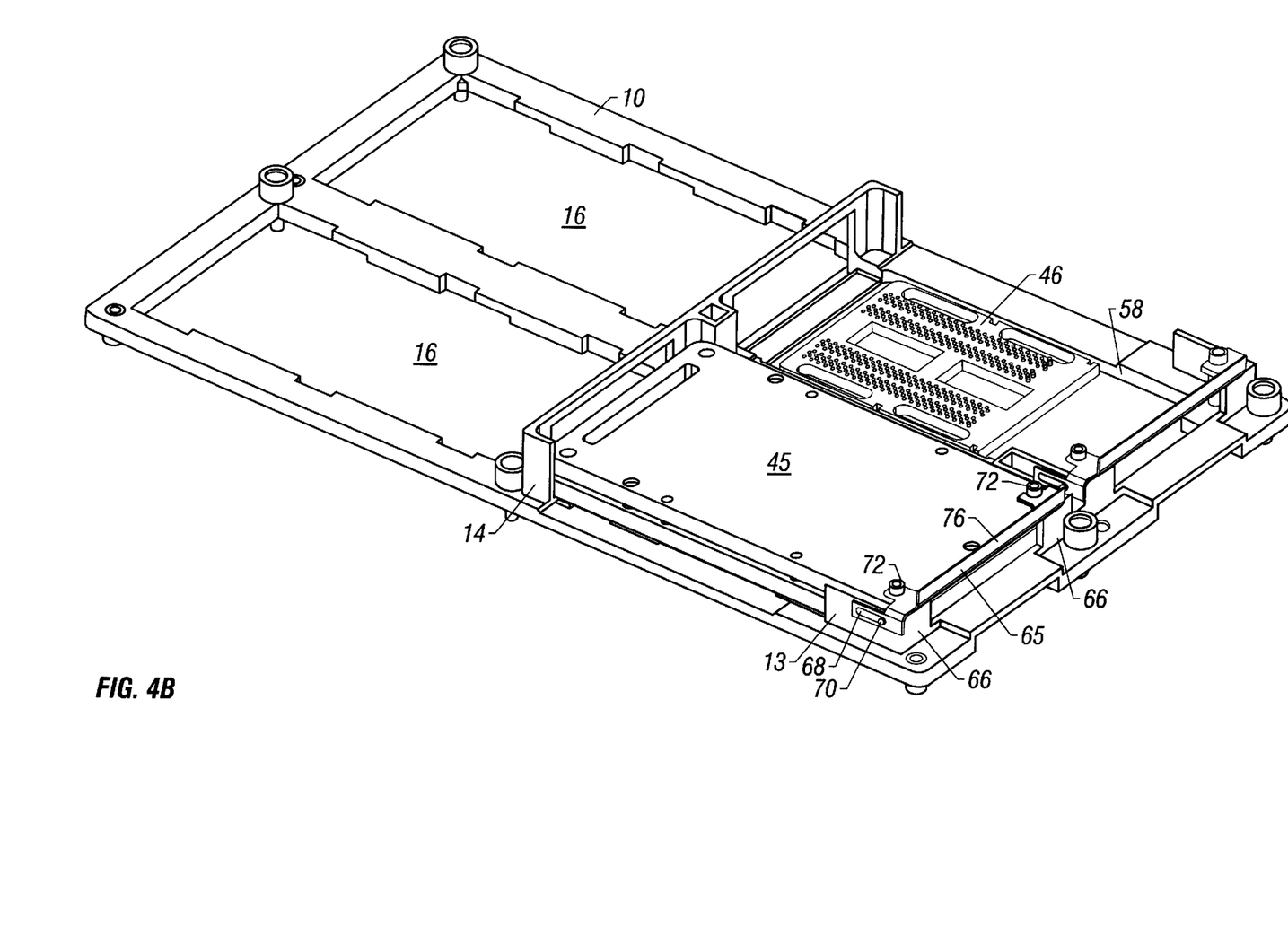

Referring now to FIGS. 4A and 4B and 5A and 5B, subassemblies of the embodiments in FIGS. 3A and 3B are respectively illustrated in unassembled and assembled views. FIGS. 4A and 4B illustrate the relationship of the bracket 10, the LIF socket 46, and the integrated circuit device 45. FIGS. 4A and 4B show the integrated circuit device 45 inserted into the LIF socket 46. Pins (not shown) on the hidden side of the integrated circuit device 45 are inserted into corresponding openings in the LIF socket. As the integrated circuit device 45 is positioned between the containment members 13 and 14, the retaining pins 72 pass through the openings 74 in the integrated circuit device 45, extending above the upper surface thereof and exposing the recessed rings 71. The spring clip 65 is then translated inwardly and over the upper surface of the integrated circuit device 45 until the notches 73 engage with the recessed rings 71 to capture the integrated circuit device therein. FIGS. 5A and 5B illustrate the relationship of the bracket 10, the ZIF socket 54, and the integrated circuit devices 45. In each case, the mounting bracket 10 vertically restrains the respective integrated circuit devices 45 when assembly is complete. The term "vertically" as used herein shall be defined relative to the base 12 of the bracket 10 regardless of the orientation with respect to gravity. More particularly, a spring clip 65 of containment member 13 includes a lip 76 that, as illustrated in FIGS. 4B and 5B, slips over the top of integrated circuit device 45 to vertically restrain device 45 when assembled.

When assembled, edges 58 of the openings 16, shown in FIG. 1, at least partially circumscribe the sockets 46 and 54, as shown in FIGS. 4A and 4B and 5A and 5B. Note that this structural relationship does not require actual physical engagement or even contact between the edges 58 and the sockets 46 and 54, although such contact may be desirable in some embodiments. Some embodiments may employ only close juxtaposition. The acceptable separation between the edges 58 and the sockets 46 and 54 will vary, as will be recognized by those in the art having the benefit of this disclosure, depending on a number of factors. Two primary factors are the amount of shock and the amount of vibration the subassembly is designed to withstand. Thus, the openings 16 are "shaped to accommodate" the respective sockets 46 and 54 in that they affect the structural relationship in which the edges 58 thereof at least partially circumscribe the respective sockets 46 and 54. Although not shown, the edges 58 of the openings 16 of the particular embodiments illustrated also at least partially circumscribe the power pods 48 in the manner described above for the sockets 46 and 54.

Returning to FIGS. 4B and 5B, the containment members 13 and 14 rigidly extending from the base 12 of the bracket 10 laterally constrain the integrated circuit devices 45. The term "laterally" is defined relative to the base 12 regardless of the orientation relative to gravity. This structural relationship also does not require actual physical engagement or even contact between the containment members 13 and the integrated circuit devices 45, although such contact is desirable in some embodiments. Alternative embodiments may employ only close juxtaposition. The acceptable separation, if any, between the containment members 13 and the integrated circuit devices 45 will vary, as will be recognized by those in the art having the benefit of this disclosure, depending on a number of factors. Two primary factors are the amount of shock and the amount of vibration the subassembly is designed to withstand.

Referring more particularly now to FIGS. 4A and 5A, the PC board assembly is constructed by first inserting the retention pins 72 through the mounting bracket 10 and affixing the mounting bracket 10 to printed circuit board 40 as shown in FIGS. 3A and 3B. Returning to FIGS. 4A and 5A, assembly continues by aligning the bores 74 in the packaging of integrated circuit device 45 with the corresponding retention pins 72 and the contact pins (not shown) protruding from the bottom of integrated circuit device 45 with the corresponding holes in sockets 46 and 54, respectively. Integrated circuit 45 is then inserted into the sockets 46 and 54 as is known in the art. The spring clip 65 is then engaged with the flange 66 and the retention pins 72 as described above. As shown in 4B and 5B, the spring clips 65 include a lip 76 that, when the spring clip 45 is engaged with the flanges 66, and retention pins 72, vertically restrains integrated circuit device 45.

The particular embodiments disclosed above are illustrative only as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A printed circuit board assembly comprising:
    a printed circuit board; and
    a bracket affixed to the printed circuit board, the bracket further comprising:
        a base having an opening receiving a socket coupling an integrated circuit device; and
        at least one containment member rigidly extending from the base forming a void and receiving the integrated circuit.

2. The assembly of claim 1, wherein the containment member and the base are integrally formed.

3. The bracket of claim 1, wherein the containment member includes:
    a plurality of retention pins extending through the base;
    a flange rigidly extending from the base, the flange having a plurality of buttons protruding therefrom; and
    a clip having a plurality of slots, each of the plurality of slots being engaged with a respective one of the buttons, and a plurality of notches, each of the plurality of notches being snap-fit to a respective retention pin.

4. The assembly of claim 1, wherein at least one of the containment member and the base comprises a plastic.

5. The assembly of claim 1, wherein the containment member includes a notch.

6. The assembly of claim 1, wherein the notch is contiguous with the opening.

7. The assembly of claim 1, further comprising a second containment member.

8. The assembly of claim 1, wherein the opening is shaped to accommodate at least one of a low insertion force socket and a zero insertion force socket.

9. The assembly of claim 1, wherein the opening is also shaped to accommodate a power pod.

10. The assembly of claim 1, wherein the base includes at least one die.

11. The assembly of claim 1, further comprising:
    a socket mounted to the printed circuit board; and
    an integrated circuit coupled to the socket.

12. A printed circuit board assembly comprising
    a printed circuit board; and
    a bracket affixed to the printed circuit board, the bracket further comprising:
        a base having an opening receiving at least one of a low insertion force socket and a zero insertion force socket coupling an integrated circuit device and to accommodate a power pod, the base having at least one die; and
        a first containment member rigidly extending from the base, the first containment member containing a notch;
        a second containment member rigidly extending from the base to define in conjunction with the first containment member a void and receiving the integrated circuit, the second containment member including:
            a plurality of retention pins extending through the base;
            a flange rigidly extending from the base, the flange having a plurality of buttons protruding therefrom; and
            a clip having a plurality of slots, each of the plurality of slots being engaged with a respective one of the buttons, and a plurality of notches, each of the plurality of notches being snap-fit to a respective retention pin;

wherein the base, the first containment member, and the flange of the second containment member are integrally formed and comprise a hardened, molded plastic.

13. A printed circuit board assembly comprising:
a printed circuit board;
at least one of a low insertion force socket and a zero insertion force socket mounted to the printed circuit board;
an integrated circuit device inserted into the socket;
a power pod powering the integrated circuit and mounted to the printed circuit board;
a bracket affixed to the printed circuit board, the bracket further comprising:
  a base having an opening receiving at least one of a low insertion force socket and a zero insertion force socket coupling the integrated circuit device and a power pod, the base having at least one die; and
  a first containment member rigidly extending from the base, the first containment member containing a notch;
  a second containment member rigidly extending from the base to define in conjunction with the first containment member a void and receiving the integrated circuit, the second containment member including:
    a plurality of retention pins extending through the base;
    a flange rigidly extending from the base, the flange having a plurality of buttons protruding therefrom; and
    a clip having a plurality of slots, each of the plurality of slots being engaged with a respective one of the buttons, and a plurality of notches, each of the plurality of notches being snap-fit to a respective retention pin;
  wherein the base, the first containment member, and the flange of the second containment member are integrally formed and comprise a hardened, molded plastic.

14. A method for mounting an integrated circuit device to a printed circuit board, the method comprising:
affixing a bracket to the printed circuit board, wherein the bracket comprises
  a base having an opening shaped to accommodate a socket for the integrated circuit;
mounting a socket to the opening in the base; and
coupling the integrated circuit to the socket, the integrated circuit being vertically and laterally constrained by the bracket.

15. The method of claim 14, wherein the bracket comprises:
at least one containment member rigidly extending from the base to define a void shaped to accommodate the integrated circuit.

16. The method of claim 14, wherein mounting the socket includes surface mounting the socket.

17. The method of claim 14, wherein the socket is at least one of zero insertion force socket and a low insertion force socket.

18. The method of claim 14, wherein the integrated circuit is a processor.

19. A method for mounting a processor to a printed circuit board, the method comprising:
affixing a bracket to the printed circuit board, the bracket including:
  a base having an opening shaped to accommodate a socket for an integrated circuit device; and
  at least one containment member rigidly extending from the base to define a void shaped to accommodate the integrated circuit;
surface mounting at least one of a zero insertion force socket and a low insertion force socket to the printed circuit board; and
coupling the integrated circuit to the socket, the integrated circuit being vertically and laterally constrained by the bracket.

* * * * *

UNITED STATES PATENT AND TRADEMARK OFFICE
CERTIFICATE OF CORRECTION

PATENT NO. : 6,002,591
DATED : December 14, 1999
INVENTOR(S) : McCutchan et al.

It is certified that error appears in the above-identified patent and that said Letters Patent is hereby corrected as shown below:

Column 3,
Line 22, delete "is".

Signed and Sealed this

Twenty-seventh Day of April, 2004

JON W. DUDAS
*Acting Director of the United States Patent and Trademark Office*